United States Patent
Maeda et al.

(10) Patent No.: US 6,890,817 B2
(45) Date of Patent: May 10, 2005

(54) METHOD OF MANUFACTURING A SEMICONDUCTOR DEVICE WITH CAPACITOR ELECTRODES

(75) Inventors: Hiroshi Maeda, Hyogo (JP); Toshiyuki Oashi, Hyogo (JP); Takashi Uehara, Osaka (JP)

(73) Assignees: Renesas Technology Corp., Tokyo (JP); Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/633,576

(22) Filed: Aug. 5, 2003

(65) Prior Publication Data

US 2004/0021165 A1 Feb. 5, 2004

Related U.S. Application Data

(62) Division of application No. 09/903,735, filed on Jul. 13, 2001, now Pat. No. 6,630,705.

(30) Foreign Application Priority Data

Aug. 10, 2000 (JP) ........................................ 2000-242303

(51) Int. Cl.⁷ ........................................ H01L 21/8242
(52) U.S. Cl. ........................ 438/253; 438/254; 438/255; 438/256; 438/396; 438/397; 438/398; 438/399
(58) Field of Search ................................. 438/253–256, 438/396–399; 257/303–310

(56) References Cited

U.S. PATENT DOCUMENTS 6,255,151 B1   7/2001   Fukuda et al. .............. 257/296
6,424,011 B1   7/2002   Assaderaghi et al. ....... 257/350
6,759,703 B1 * 7/2004   Matsuhashi ................. 257/306

FOREIGN PATENT DOCUMENTS

JP    1999-0062885    7/1999

OTHER PUBLICATIONS

M. Igarashi, A. Harada, H. Amishiro, H. Kawashima, N. Morimoto, Y. Kusumi, T. Saito, A. Ohsaki, T. Mori, T. Fukada, Y. Toyoda, K. Higashitani, and H. Arima, "The Best Combination Of Aluminium and Copper Interconnects For a High Performance 0.18μm CMOS Logic Device," IEDM98, 1998, pp. 829–832.

J. Heidenreich, D. Edelstein, R. Goldblatt, W. Cote, C. Uzoh, N. Lustig, T. McDevitt, A. Stamper, A. Simon, J. Dukovic, R. Wachnik, H. Rathore, S. Luce, and J. Slattery, "Copper Dual *Damascene* Wiring for Sub–0.25μm CMOS Technology," pp. 13–15.

* cited by examiner

*Primary Examiner*—Thien F Tran
(74) *Attorney, Agent, or Firm*—McDermott Will & Emery LLP (57) ABSTRACT

A semiconductor device and a method of manufacturing thereof can be gained wherein the occurrence of defects can be prevented and it is possible to reduce the manufacturing cost. The semiconductor device includes a capacitor electrode, an insulating layer and a wiring layer. The capacitor electrode is formed on the semiconductor substrate. The insulating film which is formed on the capacitor electrode has a trench which exposes part of the capacitor electrode and has an upper surface. The wiring layer fills in the inside of the trench, has an upper surface and is connected with the capacitor electrode. The upper surface of the wiring layer is located on approximately the same plane as the upper surface of the insulating film.

4 Claims, 9 Drawing Sheets

METHOD OF MANUFACTURING A SEMICONDUCTOR DEVICE WITH CAPACITOR ELECTRODES

This application is a divisional of application Ser. No. 09/903,735 filed Jul. 13, 2001, now U.S. Pat. No. 6,630,705.

BACKGROUND OF THE INVENTION

1. Field of the Invention

The present invention relates to a semiconductor device and a manufacturing method thereof, in particular to a semiconductor device with capacitor electrodes and a manufacturing method thereof.

2. Description of the Background Art

Figure 9:
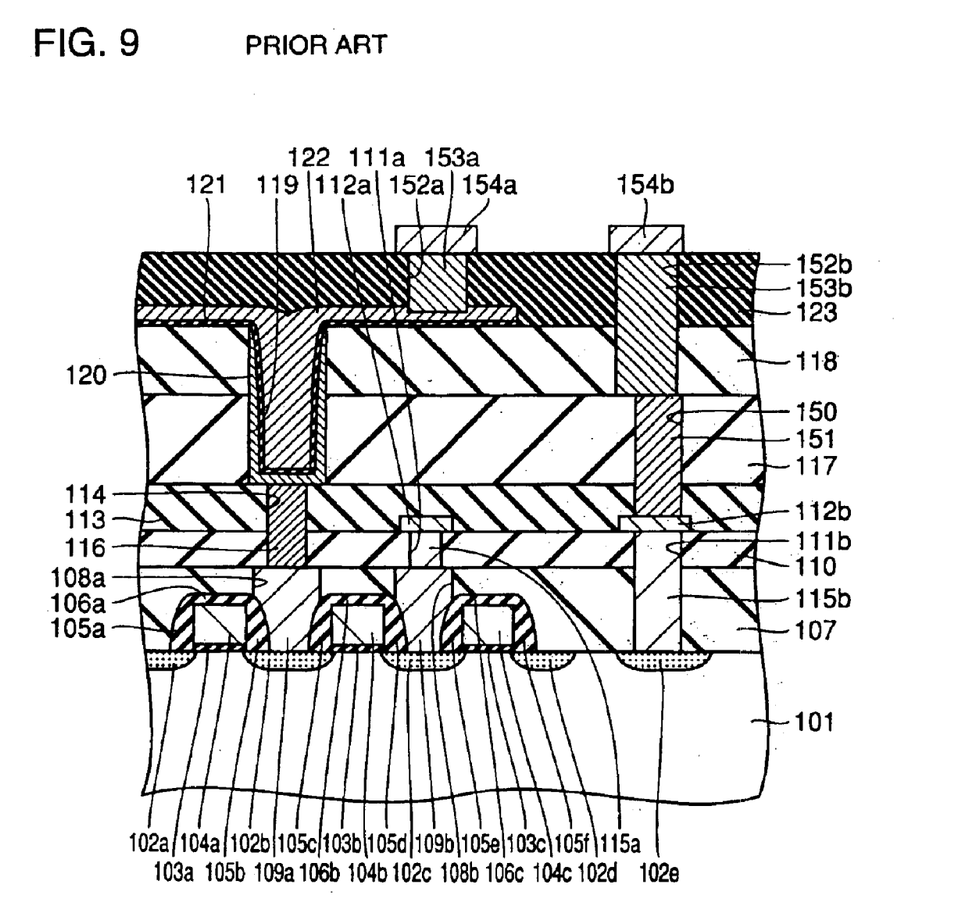
FIG. 9 is a schematic cross section view showing a DRAM as a semiconductor device according to a prior art.

Conventionally a DRAM (Dynamic Random Access Memory) as one of the semiconductor devices is known. FIG. 9 is a schematic cross section view showing a semiconductor device according to a prior art. The semiconductor device according to a prior art is described with reference to FIG. 9.

Referring to FIG. 9, the semiconductor device is a DRAM which includes a field effect transistor and a capacitor formed on a semiconductor substrate 101. The capacitor stores an electric charge as a memory signal. And the field effect transistor works as a switching element which controls the storage of the electric charge to the capacitor. Conductive regions 102a to 102e are formed in the main surface of the semiconductor substrate 101 with gaps between the regions. The conductive regions 102a to 102d become source and drain regions of the field effect transistors. A gate insulating film 103a to 103c is formed on the semiconductor substrate 101 above the channel regions located between the conductive regions 102a to 102d. Gate electrodes 104a to 104c are formed on the gate insulating film 103a to 103c. A side wall insulating film 105a to 105f is formed on the side walls of the gate electrodes 104a to 104c. A coating insulating film 106a to 106c is formed on the gate electrodes 104a to 104c. A field effect transistor is formed of the gate electrode 104a, the gate insulating film 103a and conductive regions 102a and 102b as the source and drain regions, respectively. Another field effect transistor is formed of the gate electrode 104b, the gate insulating film 103b and the conductive regions 102b and 102c as the source and drain regions, respectively. Still another field effect transistor is formed of the gate electrode 104c, the gate insulating film 103c and the conductive regions 102c and 102d as the source and drain regions, respectively.

The first interlayer insulating film 107 is formed on the coating insulating film 106a to 106c, the side wall insulating film 105a to 105f and the main surface of the semiconductor substrate 101. Contact holes 108a and 108b are formed in the regions located above the conductive regions 102b and 102c in the first interlayer insulating film 107. Conductive material film 109a and 109b, such as a doped polysilicon film, is filled in inside the contact holes 108a and 108b. The second interlayer insulating film 110 is formed on the first interlayer insulating film 107. A contact hole 111a is formed in the second interlayer insulating film 110 in the regions located above the conductive material film 109b. In addition, a contact hole 111b is formed in the region located above the conductive region 102e in the main surface of the semiconductor substrate 101 by removing part of the first and the second interlayer insulating films 107 and 110. A conductive material film 115a and 115b, such as a tungsten film, is filled in inside of the contact holes 111a and 111b, respectively. The first wiling layers 112a and 112b are formed on the conductive material film 115a and 115b, respectively.

The third interlayer insulating film 113 is formed on the first wiling layer 112a and 112b and the second interlayer insulating film 110. A contact hole 114 is formed in the reference located above the conductive material film 109a by removing part of the second and of the third interlayer insulating films 110 and 113. A conductive material film 116 is filled in inside of the contact hole 114.

The fourth interlayer insulating film 117 is formed on the third interlayer insulating film 113. A contact hole 150 is formed in the region located above the first wiring layer 112b by removing part of the third and the fourth interlayer insulating films 113 and 117. A conductive material film 151 is filled in inside of the contact hole 150.

The fifth interlayer insulating film 118 is formed on the fourth interlayer insulating film 117. An aperture part 119 is formed in the regions located above the conductive material film 116 by removing part of the fourth and the fifth interlayer insulating film 117 and 118. A capacitor lower electrode 120 which is connected to the conductive material film 116 is formed inside of the aperture part 119. A dielectric film 121 is formed so as to extend from the capacitor lower electrode 120 to the upper surface of the fifth interlayer insulating film 118. A capacitor upper electrode 122 is formed on the dielectric film 121 so as to fill in the inside of the aperture part 119 and to extend over the upper surface of the fifth interlayer insulating film 118. A capacitor is formed of the capacitor lower electrode 120, the dielectric film 121 and the capacitor upper electrode 122.

The sixth interlayer insulating film 123 is formed on the capacitor upper electrode 122 and the fifth interlayer insulating film 118. A contact hole 152a is formed in the region located above the capacitor upper electrode 122 of the sixth interlayer insulating film 123. A contact hole 152b is formed in the region located above the conductive material film 151 by removing part of the fifth and the sixth interlayer insulating films 118 and 123. A conductive material film 153a and 153b, such as a tungsten film, is filled in inside of the contact holes 152a and 152b. The conductive material film 153a is connected to the capacitor upper electrode 122. The conductive material film 153b is connected to the conductive material film 151. The second wiring layer 154a and 154b, made of aluminum or the like, is formed on the conductive material film 152a and 152b. The second wiring layer 154a is utilized to fix the potential of the capacitor upper electrode 122. In a semiconductor device such as a DRAM, as shown in FIG. 9, a plurality of memory cells with capacitors are arranged in a matrix form on the substrate 101. Then, an interlayer insulating film (not shown) is formed on the second wiring layer 154a and 154b.

As for semiconductor devices as represented by DRAM the demand for miniaturization and high levels of integration continues to grow strongly. Therefore, the size of a memory cell of a DRAM as shown in FIG. 9 is becoming smaller and smaller. However, it is necessary to store a specific amount of electric charge in a capacitor which stores an electric charge in a memory cell. Therefore, capacitor structures which are in the form of extending in the vertical direction, such as a cylindrical type capacitor as shown in the figures or a thick film type capacitor, have been adopted for the purpose of securing the capacitance of the capacitors while making the size of the memory cells smaller. On the other hand, it is necessary to connect the first wiring 112b, which is connected to the conductive region 102e, with the second wiling layer 154b via the contact holes 152b and 150 for the purpose of supplying a signal to, or of fixing the potential of, the conductive region 102e, or the like, which is located below the capacitor upper electrode 122. At this time, the contact hole 152a, located above the capacitor upper electrode 122, and the contact hole 152b, located below the second wiring layer 154b, have different depths due to the structure of the capacitor. Thereby, in the case that those contact holes 152a and 152b are formed in one etching step, it is necessary to continue the etching until the contact hole 152b achieves a predetermined depth. At this time, the capacitor upper electrode 122 undergoes excessive etching at the bottom of the contact hole 152a. As a result of this, the problem arises that the capacitor upper electrode 122 receives damage or the contact hole 152a penetrates the capacitor upper electrode 122. Therefore, conventionally the etching step of forming the contact hole 152a and the etching step of forming the contact hole 152b are carried out separately. As a result of this, the number of steps for a process of the semiconductor device has increased and this becomes the cause of increased manufacturing cost of a semiconductor device.

In addition, overlapping mask errors in the lithography process for forming the second wiring layer 154a and 154b and the lithography process for forming contact holes 152a and 152b make the positions of the second wiring layer 154a and 154b and the contact holes 152a and 152b shift. In this case, the second wiring layer 154a and the capacitor upper electrode 122 are not connected and, therefore, defects occur in the semiconductor device.

In addition, together with the miniaturization of semiconductor devices the wiring width, the wiling height (section area of the wiring) and the gap between wires of the second wiling layer 154a and 154b need to be made smaller. However, as the section area of wires becomes smaller in this way the wire resistance of the second wiring layer 154a and 154b increases. Such an increase of the wire resistance leads to a wiling delay. As a result of this some necessary characteristics, such as operational speed, fail to be achieved in the semiconductor device and, in some cases, defects nonetheless occur.

SUMMARY OF THE INVENTION

The purpose of the present invention is to provide a semiconductor device and a process for the same wherein it is possible to prevent the occurrence of defects and to reduce the manufacturing cost.

A semiconductor device according to one aspect of this invention includes capacitor electrodes, an insulating film and a wiring layer. Capacitor electrodes are formed on the semiconductor substrate. The insulating film, formed on the capacitor electrodes, has trenches, which expose parts of the capacitor electrodes, and an upper surface. The wiling layer is filled in inside of the trenches, has an upper surface and is connected to the capacitor electrodes. The upper surface of the wiring layer is located on approximately the same plane as the upper surface of the insulating film.

In this way, the wires connected to the capacitor electrodes can be in a so-called damascene wiling structure and, therefore, the process for the semiconductor device can be simplified to a greater degree than in the prior art.

In addition, conventionally the capacitor electrodes and a wiring layer, made of aluminum or the like, are connected via a conductive material film, such as tungsten plugs, formed inside of the contact holes. Therefore, the connection interface between the wiring layer and the conductive material film becomes a connection interface between different types of materials, which enhances the interface resistance, or the like, and, therefore, the resistance against electromigration has been reduced. In the present invention, however, the wiling layer is of the damascene wiling structure while parts of the capacitor electrodes are exposed in the trenches so that the lower surface of the wiling layer is in the state directly connected to the capacitor electrodes. Therefore, it is not necessary to form tungsten plugs. Therefore, the resistance against electromigration of the wiring layer can be prevented from becoming reduced.

In addition, by forming trenches in the insulating film and by filling in the inside of the trenches with a conductive material film, the formation of the wiring layer and the contact of the wiring layer with the capacitor electrodes can be implemented at the same time and, therefore, no problem occurs wherein the contact holes and the wiring layer, which is supposed to be formed above these contact holes, become shifted in position, as in the prior art. Accordingly, the occurrence of defects due to such a position shift can be prevented.

In addition, since the upper surface of the wiring layer and the upper surface of the insulating film are located approximately on the same plane, no step exists due to this wiring layer on the upper surface of this wiring layer. Therefore, in the case that another insulating film, or the like, is formed on the insulating film, no step is formed on the upper surface of that other insulating film due to the steps on the upper surface of the wiring layer. Accordingly, in the case that an upper layer wiling layer, or the like, is formed on that other insulating film, defects such as a discontinuity of the upper layer wiring layer due to the above described steps can be prevented from occurring.

In addition, there are cases where another wiring layer formed in the same layer as the wiring layer and the above described conductive region are connected for the purpose of supplying a signal to a conductive region located below the capacitor electrodes. At this time, in a region which is not overlapped with the capacitor electrodes in the same plane, it is necessary to form another contact hole which reaches the above described conductive region, a conductive material film which is filled in inside of that other contact hole and another wiring layer connected to the conductive material film in the insulating film. On the other hand, conventionally a contact hole is formed for the connection between the capacitor electrodes and the wiling layer. Then, since this contact hole and the above described other contact hole have different depths, it is necessary to form them in separate etching steps, respectively. This is because the semiconductor device is miniaturized so as to have a structure where the capacitors extend in the vertical direction and the difference of the depths between the contact hole and the above described other contact hole becomes, increasingly, larger. In the present invention, however, no contact hole is formed on the capacitor electrodes and the lower surface of the wiling layer directly contacts the capacitor electrodes. That is to say, even when the semiconductor device is miniaturized it is not necessary to form a plurality of contact holes of which the depths are different, as in a prior art and, therefore, the manufacturing process of the semiconductor device can be further simplified.

The semiconductor device, according to the above described one aspect of the present invention, may include conductive regions located below the insulating film. It is preferable that contact holes which reach to the conductive regions and the other trenches which are connected to these contact holes are formed in the insulating film. Moreover, the semiconductor device according to the above described one aspect of the present invention, preferably, includes another wiling layer which is filled in inside of the other trenches and the contact holes.

In this case, the other wiling layer formed in the insulating film can be formed in a so-called dual damascene process wherein the inside of the contact holes and the inside of the other trenches are filled in with a conductive material film. Then, as described in the manufacturing process below, the other trenches wherein the above described other wiling layer is located and the trenches where the wiling layer is located are formed in the same etching step so that, in the case that the other wiling layer is formed as described above, the increase in the number of manufacturing steps can be limited to the minimum. Therefore, the increase of the manufacturing cost of the semiconductor device can be held down.

In the semiconductor device according to the above described one aspect of the present invention, the trenches and the other trenches of the insulating film may be formed so as to extend, approximately, in parallel.

In this case, the first wiring layer which contacts the lower surface of the capacitor electrodes can be formed so as to extend parallel the second wiring layer. Accordingly, the contact area between the capacitor electrodes and the wiring layer can be increased and, therefore, the electric contact between the capacitor electrodes and the wiring layer can be made more failure proof.

In the semiconductor device according to the above described one aspect of the present invention, the trenches of the insulating film may include a plurality of aperture parts.

In this case, the contact area between the wiring layer and the capacitor electrodes can be arbitrarily changed by changing the areas of bottoms of the aperture parts. As a result of this, the electric resistance value between the wiring layer and the capacitor electrodes can be arbitrarily changed.

In addition, in the case that the trenches include a plurality of aperture parts in this way and the wiring layer is formed inside of the aperture parts, respectively, an upper layer wiring layer which is located above the wiring layer, may be formed so as to make a connection between respective wiling layer formed inside of the aperture layers.

In the semiconductor device according to the above described one aspect of the present invention, it is preferable that the wiring layer includes copper.

In this case, copper has a lower electrical resistance value than aluminum, which is conventionally used as a material for the wiring layer. Accordingly, in the case that copper is used for the material for the wiring layer the wiring resistance can be reduced more than in the prior art. Therefore, the occurrence of the wiring delay can be prevented.

In the semiconductor device according to the above described one aspect of the present invention, it is preferable that a barrier metal layer is formed on the inside walls of said trenches.

In this case, the barrier metal layer can prevent materials, such as copper, which form the wiring layer from defusing into the insulating film or the capacitor electrodes.

In a method of manufacturing a semiconductor device according to another aspect of the present invention, capacitor electrodes are formed on a semiconductor substrate. An insulating film which has an upper surface is formed on the capacitor electrodes. In the insulating film trenches are formed so as to expose parts of the capacitor electrodes. A conductive material film is formed so as to fill in inside of the trenches and to extend to the upper surface of the insulating film. By removing the conductive material film which is located on the upper surface of the insulating film and by removing parts of the conductive material film which is located on the surface of the trenches in the insulating film, a wiring layer which is made of the conductive material film which fills in inside of the trenches and has an upper surface which is located on, approximately, the same plane as the upper surface of the insulating film is formed.

Here, in a process for a wiring layer which is connected to the capacitor electrodes according to a prior art, the step of forming contact holes in the insulating film, the step of forming a conductive material film inside of the contact holes, the step of removing extra conductive material film located on the upper surface of the insulating film, the step of forming a conductive material film which becomes a wiring layer on the surface of the contact holes and the step of forming a wiling layer by partially removing this conductive material film through etching using a resist film as a mask and carried out. That is to say, according to the process for a semiconductor device in a prior art, the etching steps and the film formation steps are carried out twice, respectively. In the present invention, however, by making the wiring layer electrically connected to the capacitor electrodes have a so-called damascene wiling structure, the step of forming trenches in the insulating film, the step of forming a conductive material film which becomes the wiling layer inside of those trenches and the subsequent step of removing the conductive material film located on the upper surface of the insulating film using a chemical mechanical polishing method (CMP method), or the like, which make up a fewer number of steps than in a prior art, can, together, form the wiling layer. As a result of this, the process for a semiconductor device can be simplified. And by following these steps the semiconductor device according to the present invention can be easily manufactured.

In the method of manufacturing a semiconductor device according to above described other aspect of the present invention, conductive regions located beneath the insulating film may be formed and contact holes which reach to the conductive regions may be formed in the insulating film. The step of forming trenches may include the formation of the other trenches in the regions located above the contact holes of the insulating film. The step of forming the conductive material film may include the formation of a conductive material film which becomes the other wiling layer so as to fill in the inside of the contact holes and the other trenches.

In this case, the step of forming the other trenches located above the contact holes and the step of forming trenches which reach to the capacitor electrodes can be carried out simultaneously. Then, since the wiring layer formed inside of the trenches is directly connected to the capacitor electrodes, it is not necessary to form contact holes into which tungsten plugs, or the like, are filled in separately from the wiling layer on the capacitor electrodes as in the prior art. Therefore, the process for a semiconductor device can be simplified to a greater degree than in a prior art.

In addition, in the case that the depth of the trenches and the other trenches which are formed in one etching step in the insulating film is set at approximately the same distance from the upper surface of the insulating film to the upper surface of capacitor electrodes, excessive etching of the capacitor electrodes at the bottoms of the trenches can be prevented in this etching step. Therefore, the capacitor electrodes can be prevented from undergoing damage through excessive etching.

In the method of manufacturing a semiconductor device according to the above described other aspect of the present invention, the step of forming trenches may include the formation of trenches which extend approximately parallel to the other trenches.

In this case, the one wiring layer which extends in parallel to the other wiling layer and of which the lower surface contacts the upper surface of the capacitor electrodes can be formed. Accordingly, the contact area between the capacitor electrodes and the wiring layer can be increased. As a result of this, the electric connection between the capacitor electrodes and the wiling layer can be made without fail.

In the method of manufacturing a semiconductor device according to the above described other aspect of the present invention, the step of forming trenches may include the formation of a plurality of aperture parts in the insulating film so as to expose parts of the capacitor electrodes.

In this case, by changing the area of the bottoms of the aperture parts the contact area between the wiring layer and the capacitor electrodes can be arbitrarily changed.

In the method of manufacturing a semiconductor device according to the above described other aspect of the present invention, it is preferable for the conductive material film to include copper.

In this case, as a material of the wiling layer copper, of which the electric resistance value is lower than aluminum which is conventionally used, can be used for the wiring layer.

The foregoing and other objects, features, aspects and advantages of the present invention will become more apparent form the following detailed description of the present invention when taken in conjunction with the accompanying drawings.

DESCRIPTION OF THE PREFERRED EMBODIMENTS

In the following embodiments of the present invention are described with reference to the drawings. Here, the same, or the corresponding parts, are denoted by the same reference numerals, of which the descriptions are not repeated in the following figures.
(First Embodiment)

Figure 1:
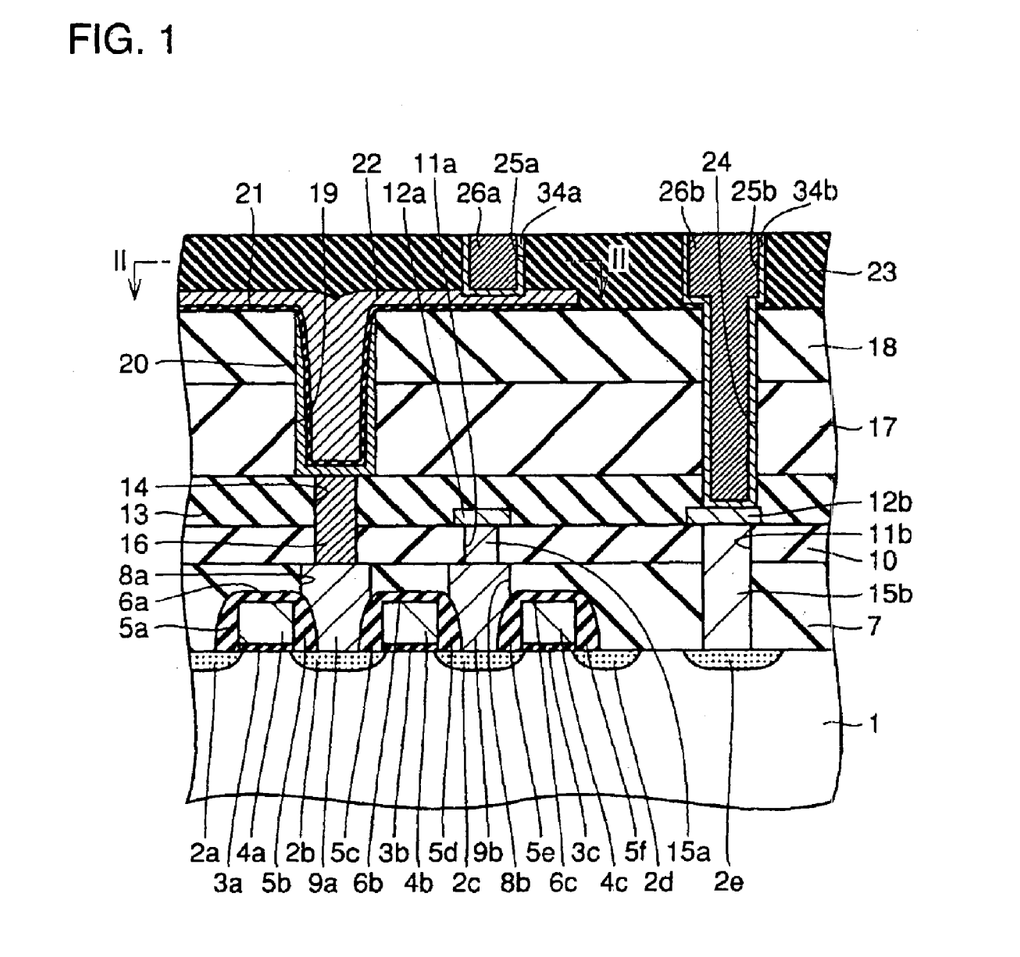
FIG. 1 is a schematic cross section view showing a first embodiment of a semiconductor device according to the present invention.
Figure 2:
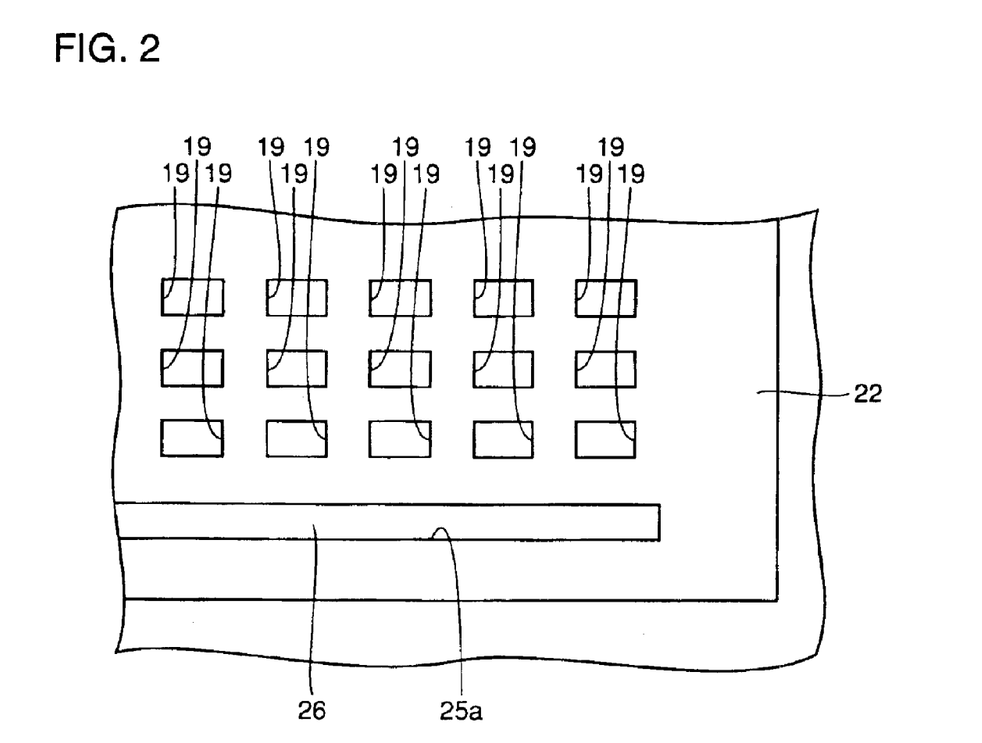
FIG. 2 is a schematic view showing a cross section along a line II—II in FIG. 1.

Referring to FIGS. 1 and 2, the first embodiment of a semiconductor device according to the present invention is described.

Referring to FIGS. 1 and 2, the semiconductor device is a DRAM which includes a field effect transistor and a capacitor formed on a semiconductor substrate 1. The capacitor stores an electric charge as a memory signal. In addition, the field effect transistor works as a switching element which controls the storage of the electric charge in the capacitor. Conductive regions 2a to 2e are formed on the main surface of the semiconductor substrate 1 with gaps between regions. The conductive regions 2a to 2d become the source and drain regions of the field effect transistor. A gate insulating film 3a to 3c is formed on the semiconductor substrate 1 above the channel regions located between the conductive regions 2a to 2d. The gate electrodes 4a to 4c are formed on the gate insulating film 3a to 3c. A side wall insulating film 5a to 5f is formed on the side walls of the gate electrodes 4a to 4c. A covering insulating film 6a to 6c, which is made of a silicon nitride film, is formed on the gate electrodes 4a to 4c. A field effect transistor is formed of the gate electrode 4a, the gate insulating film 3a and the conductive regions 2a and 2b as the source and drain regions. Another field effect transistor is formed of the gate electrode 4b, the gate insulating film 3b and the conductive regions 2b and 2c as the source and drain regions. Still another field effect transistor is formed of the gate electrode 4c, the gate insulating film 3c and the conductive regions 2c and 2d as the source and drain regions.

A first interlayer insulating film 7 is formed on the covering insulating film 6a to 6c, the side wall insulating film 5a to 5f, and the main surface of the semiconductor substrate 1. Contact holes 8a and 8b are formed in the regions located above the conductive regions 2b and 2c of the first interlayer insulating film 7. A conductive material film 9a and 9b, such as a doped polysilicon film, is filled in inside the contact holes 8a and 8b. A second interlayer insulating film 10 is formed on the first interlayer insulating film 7. A contact hole 11a is formed in the region located above the conductive material film 9b of the second interlayer insulating film 10. In addition, a contact hole 11b is formed in the region located above the conductive region 2e in the main surface of the semiconductor substrate 1 by removing part of the first and the second interlayer insulating films 7 and 10 through etching. A conductive material film 15a and 15b, such as a tungsten film or a doped polysilicon film, is filled in inside of the contact holes 11a and 11b, respectively. A first wiring layer 12a, which is made of doped polysilicon, is formed on the conductive material film 15a. And a first wiring layer 12b, which is made of doped polysilicon, is formed as a conductive region on the conductive material film 15b.

A third interlayer insulating film 13 is formed on the first wiring layer 12a and 12b and the second interlayer insulating film 10. A contact hole 14 is formed in the region located above the conductive material film 9a by removing part of the second and the third interlayer insulating films 10 and 13. A conductive material film 16 is filled in inside of the contact hole 14.

A fourth interlayer insulating film 17 is formed on the third interlayer insulating film 13. A fifth interlayer insulating film 18 is formed on the fourth interlayer insulating film 17. An aperture part 19 is formed in the region located above the conductive material film 16 by removing part of the fourth and the fifth interlayer insulating films 17 and 18. A capacitor lower electrode 20, which is connected to the conductive material film 16, is formed inside of the aperture part 19. A dielectric film 21 is formed so as to extend from the capacitor lower electrode 20 to the upper surface of the fifth interlayer insulating film 18. A capacitor upper electrode 22 is formed, on the dielectric film 21, as a capacitor electrode so as to fill in inside of the aperture part 19 and to extend to the upper surface of the fifth interlayer insulating film 18. A capacitor is formed of the capacitor lower electrode 20, the dielectric film 21 and the capacitor electrode 22.

A sixth interlayer insulating film 23 is formed as an insulating film on the capacitor upper electrode 22 and the fifth interlayer insulating film 18. A damascene wiling trench 25a is formed as a trench in the sixth interlayer insulating film 23 so as to expose part of the upper surface of the capacitor upper electrode 22. In addition, a contact hole 24 is formed in the region located above the first wiring layer 12b of the third to the sixth interlayer insulating films 13, 17, 18 and 23. A damascene wiring trench 25b is formed as another trench in the region located above the contact hole 24 of the sixth interlayer insulating film 23. The damascene wiring trenches 25a and 25b are formed so as to extend, approximately, parallel to each other. Then, part of the upper surface of the capacitor upper electrode 22 is exposed at the bottom of the damascene wiring trench 25a. Therefore, the contact area between the capacitor upper electrode 22 and a barrier metal layer 34a which is formed inside of the damascene wiring trench 25a can be made large. Accordingly, the electric contact between the capacitor upper electrode 22 and the conductive material film 26a as a damascene wiling layer can be made without fail via the barrier metal layer 34a.

A barrier metal layer 34a and 34b is formed inside of the damascene wiling trenches 25a and 25b as well as inside of the contact hole 24. A conductive material film 26a is formed as a wiring layer on the barrier metal layer 34a so as to fill in the inside of the damascene wiring trench 25a. In addition, a conductive material film 26b is formed as another wiring layer on the barrier metal layer 34b so as to fill in the inside of the damascene wiling trench 25b and the inside of the contact hole 24. This conductive material film 26a and 26b is of the so-called damascene wiring type. The upper surface of the conductive material film 26a and 26b and the upper surface of the sixth interlayer insulating film 23 are located on approximately the same plane. Copper, for example, can be used as the conductive material film 26a and 26b.

As described above, in the case that copper is used as a material for the conductive material film 26a and 26b as a wiring layer the wiring resistance can be reduced since copper has the lower electric resistance value than aluminum, which is a conventional wiring material. Therefore, the occurrence of the wiring delay can be prevented. In addition, since the barrier metal layer 34a and 34b is formed materials such as copper which forms the conductive materials film 26a and 26b can be prevented from diffusing into the sixth interlayer insulating film 23, or the like.

In addition, the conductive material film 26a is utilized so as to fix the potential of the capacitor upper electrode 22. In the semiconductor device according to the present invention, a plurality of memory cells which include capacitors and field effect transistors as shown in FIG. 1 are arranged in a matrix form on the substrate 1.

Here, in a process for a wiring layer 154a, which is connected to a capacitor upper electrode 122 according to a prior art as shown in FIG. 9, the step of forming a contact hole 152a in the sixth interlayer insulating film 123, the step of forming a conductive material film inside of the contact hole 152a, the step of forming a conductive material film 153a, such as a tungsten plug, filled in inside of the contact hole 152a by removing the extra conductive material film located on the upper surface of the sixth interlayer insulating film 123, the step of forming a conductive material film which becomes the wiring layer 154a on the contact hole 152a and the step of forming the wiring layer 154a by partially removing this conductive material film through etching using a resist film as a mask are carried out. That is to say, in the process for a semiconductor device according to a prior art etching steps and film formation steps are carried out twice, respectively.

Referring to FIG. 1, however, by making the wiring layer which includes a conductive material film 26a electrically connected to the capacitor upper electrode 22 be a damascene wiring structure according to the present invention, a fewer number of steps than in the prior art: the step of forming a damascene wiring trench 25a in the sixth interlayer insulating film 23, the step of forming a conductive material film which becomes the wiring layer so as to extend from the inside of this damascene wiring trench 25a to the upper surface of the sixth interlayer insulating film 23 and the subsequent step of forming the conductive material film 26a by removing the conductive material film located on the upper surface of the sixth interlayer insulating film 23 using a CMP method, or the like, as shown in the process described later, are necessary for forming the wiling layer. As a result of this, the process for the semiconductor device can be simplified.

In addition, in the semiconductor device according to the present invention as shown in FIG. 1, the damascene wiling, which includes a conductive material film 26a as the wiring layer which is connected to the capacitor upper electrode 22, is used and the lower surface of the damascene wiling is in the condition connected with the capacitor upper electrode 22 via the barrier metal layer 34a. Therefore, it is not necessary to form the contact hole 152a (see FIG. 9) and the conductive material film 153a, such as a tungsten plug (see FIG. 9), as in the prior art. Therefore, the interface between different types of materials which is formed between the wiring layer 154a and the conductive material film 153a, such as a tungsten plug, in the conventional semiconductor device does not exist in the semiconductor device according to the present invention. Accordingly, the resistance against electromigration in the wiring layer connected to the capacitor upper electrode 22 can be prevented from being reduced.

In addition, in the semiconductor device as shown in FIG. 1, the formation of the conductive material film 26a as the wiring layer and the connection between that conductive material film 26a and the capacitor upper electrode 22 are implemented simultaneously by forming a damascene wiring trench 25a in the sixth interlayer insulating film 23 and by filling in the inside of that damascene wiling trench 25a with the conductive material film. Therefore, no problem arises wherein the contact hole 152a (see FIG. 9) and the wiling layer 154a (see FIG. 9) are shifted in position due to the error in the lithography processing step as in the prior art. Accordingly, the occurrence of defects due to such a position shift can be prevented.

In addition, since the upper surface of the conductive material film 26a and the upper surface of the sixth interlayer insulating film 23 are located approximately on the same plane, no step is formed on the upper surface of this sixth interlayer insulating film 23 due to the conductive material film 26a. Therefore, in the case that another insulating film, or the like, is formed on the sixth interlayer insulating film 23, the deterioration of the planarity on the top surface of the other insulating film, due to the step on the upper surface of the sixth interlayer insulating film 23, can be prevented. Accordingly, in the case that an upper layer wiling layer, or the like, is formed on the other insulating film, defects such as a discontinuity of the upper layer wiring layer due to the deterioration of the planarity on the upper surface of the other insulating film can be prevented from occurring.

Next, the process of a semiconductor device as shown in FIGS. 1 and 2 is described referring to FIGS. 3 to 6.

Figure 3:
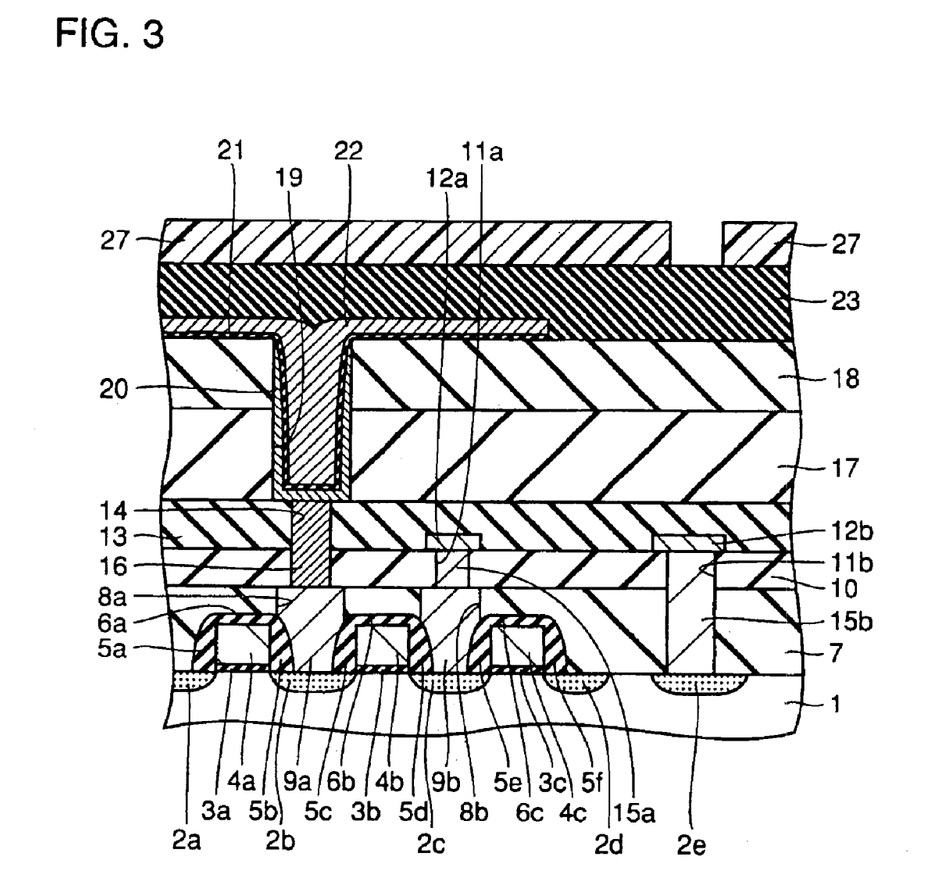
FIGS. 3 to 6 are, respectively, schematic cross section views for describing the first to the fourth steps of a process for a semiconductor device as shown in FIG. 1.

First, an insulating film which becomes the gate insulating film 3a to 3c (see FIG. 3) is formed on the main surface of a semiconductor substrate 1 such as a silicon wafer (see FIG. 3). A conductive material film which becomes the gate electrodes 4a to 4c (see FIG. 3) is formed on this insulating film. A resist film having a gate electrode pattern is formed on this conductive material film. By partially removing the conductive material film and the insulating film using this resist film as a mask the gate electrodes 4a to 4c and the gate insulating film 3a to 3c are formed. Next, by implanting a conductive impurity into the main surface of the semiconductor substrate 1 using the gate electrodes 4a to 4c, or the like, as a mask, the conductive regions 2a to 2e (see FIG. 3) are formed. Moreover, the conductive region 2e may be formed in advance by implanting a conductive impurity into the main surface of the semiconductor substrate 1 using the resist film, or the like, as a mask.

The side wall insulating film 5a to 5f and the covering insulating film 6a to 6c are formed on the side walls and on the upper surface of the gate electrodes 4a to 4c. The first interlayer insulating film 7 (see FIG. 3) is formed on the covering insulating film 6a to 6c and on the side wall insulating film 5a to 5f by using a CVD method (Chemical Vapor Deposition method), or the like. A resist film (not shown) which has a hole pattern is formed on the first interlayer insulating film 7. By using this resist film as a mask part of the first interlayer insulating film 7 is partially removed through etching. After that, the resist film is removed. In this way, the contact holes 8a and 8b (see FIG. 3) are formed. A conductive material film is formed so as to fill in inside of the contact holes 8a and 8b and to extend to the upper surface of the first interlayer insulating film 7. By removing the conductive material film located on the upper surface of the first interlayer insulating film 7 through etching, or the like, the conductive material film 9a and 9b (see FIG. 3) is formed.

The second interlayer insulating film 10 (see FIG. 3) is deposited on the first interlayer insulating film 7 by using a CVD method, or the like. A resist film which has a hole pattern is formed on the second interlayer insulating film 10. By partially removing the second interlayer insulating film 10 using the film as a mask, the contact holes 11a and 11b (see FIG. 3) are formed, The upper surface of the conductive material film 9b is exposed at the bottom of the contact hole 11a. And the conductive region 2e is exposed at the bottom of the contact hole 11b. After that, the resist film is removed. A conductive material film which fills in inside of the contact holes 11a and 11b and which extends to the upper surface of the second interlayer insulating film 10 is formed by using a sputtering method, or the like. As for the material of the conductive material film, tungsten, for example, or the like, can be used. Part of the conductive material film which is located on the upper surface of the second interlayer insulating film 10 is removed. In this way, the conductive material film 15a and 15b is formed.

After that, a conductive material film is formed on the second interlayer insulating film 10. A resist film which has a wiring pattern is formed on this conductive material film. By partially removing the conductive material film through etching, the first wiring layer 12a and 12b (see FIG. 3) is formed. After that, the resist film is removed. The third interlayer insulating film 13 is formed on the first wiring layer 12a and 12b by using a CVD method, or the like. A resist film which has a hole pattern is formed on the third interlayer insulating film 13. By using the resist film as a mask the second and third interlayer insulating film 10 and 13 are partially removed through etching, or the like, and, thereby, the contact hole 14 (see FIG. 3) is formed. After that, the resist film is removed. Next, a conductive material film which fills in the inside of the contact hole 14 and which extends to the upper surface of the third interlayer insulating film 13 is formed. By removed the conductive material film which is located on the upper surface of the third interlayer insulating film 13, the conductive material film 16 is formed.

The fourth interlayer insulating film 17 is formed on the third interlayer insulating film 13 by using a CVD method, or the like. The fifth interlayer insulating film 18 is formed on the fourth interlayer insulation layer 17 by using a CVD method, or the like. The resist film (not shown) which has a hole pattern is formed on the fifth interlayer insulating film 18. By using the resist film as a mask the fourth and the fifth interlayer insulating film 17 and 18 are partially removed through etching and, thereby, the aperture part 19 is formed. The conductive material film 16 is exposed at the bottom of the aperture part 19. After that, the resist film is removed.

A conductive material film which becomes the capacitor lower electrode is formed so as to extend from the inside of the aperture part 19 to the upper surface of the fifth interlayer insulating film 18. Next, a resist film (not shown) is formed on the conductive material film so as to fill in the inside of the aperture part 19 in the regions located inside of the aperture part 19. After that, the conductive material film which is located on the upper surface of the fifth interlayer insulating film 18 is removed through dry etching. Here, in the step of removing this conductive material film, a CMP method may be used. After that, the resist film is removed. In this way, the capacitor lower electrode 20 which is made of a conductive material film is formed inside of the aperture part 19.

Next, a dielectric film is formed so as to extend from the capacitor lower electrode 20 inside of the aperture part 19 to the upper surface of the fifth interlayer insulating film 18. A conductive material film which becomes the capacitor upper electrode 22 is formed on the dielectric film. A resist film which has a mask pattern is formed on the conductive material film using the resist film as a mask the conductive material film and the dielectric film are partially removed and, thereby, the dielectric film 21 and the capacitor upper electrode 22 which make up the capacitor are formed. Here, as for the materials for the capacitor lower electrode 20 and the capacitor upper electrode 22, polysilicon, amorphous silicon, or the like, can be used. In addition, in the case that a dielectric film such as BST or PZT is used as the material for the dielectric film 21, metals such as platinum or ruthenium, high melting point metal such as titanium, titanium nitride or a film consisting of a plurality of these layers may be used as the materials for the capacitor lower electrode 20 and capacitor upper electrode 22.

Next, the sixth interlayer insulating film 23 is formed on the capacitor upper electrode 22. A resist film 27 which has a hole pattern is formed on the sixth interlayer insulating film 23. In this way, a structure as shown in FIG. 3 is gained.

Figure 4:
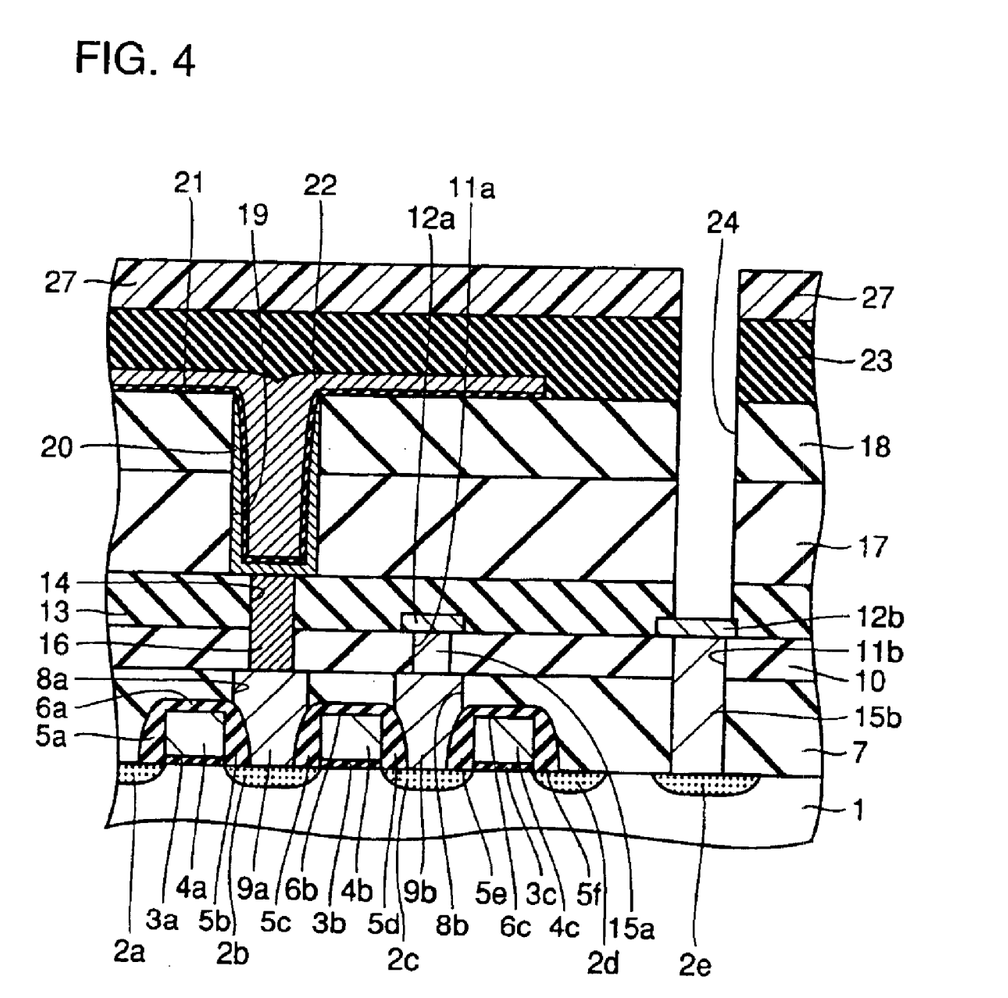

Next, as shown in FIG. 4, by using the resist film 27 as a mask the third to the sixth interlayer insulating film 13, 17, 18 and 23 are partially removed through etching and, thereby, the contact hole 24 is formed. After that, the resist film 27 is removed.

Figure 5:
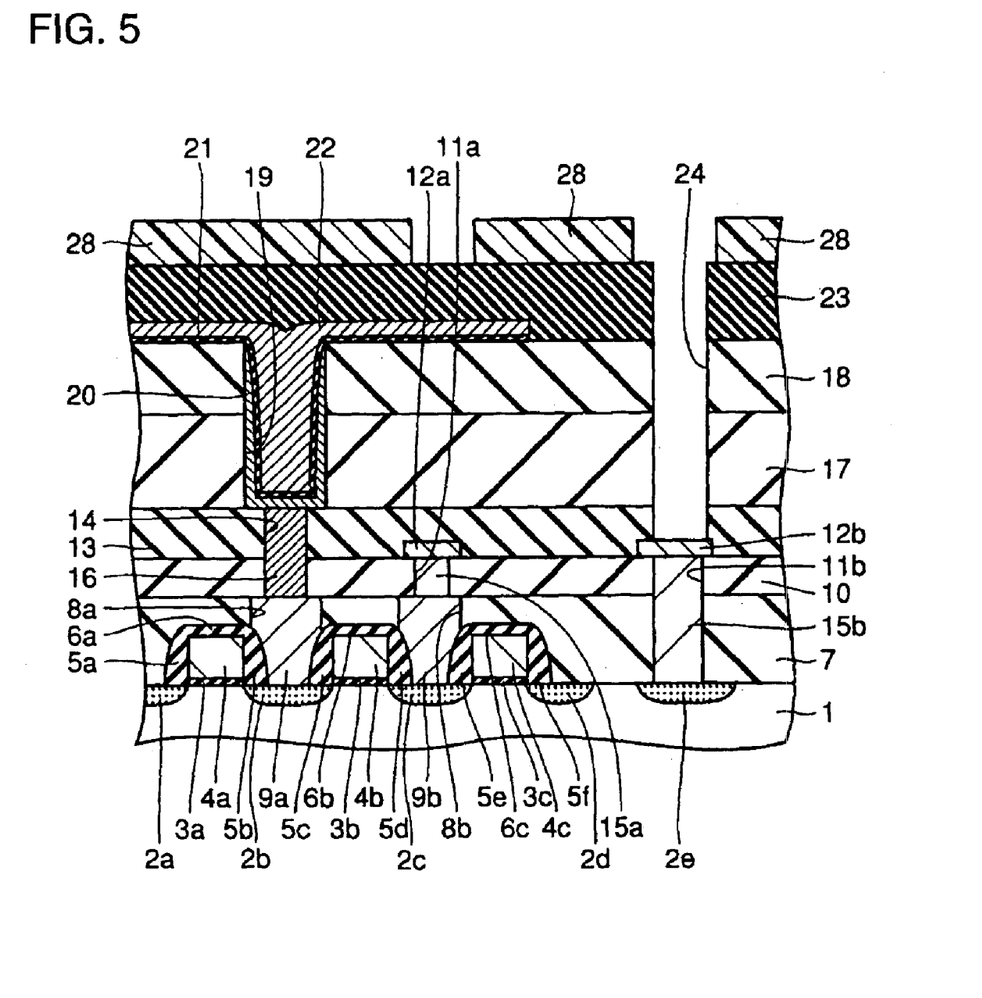

Next, as shown in FIG. 5, a resist film 28 which has a pattern for the damascene wiling trenches is formed on the sixth interlayer insulating film 23.

Figure 6:
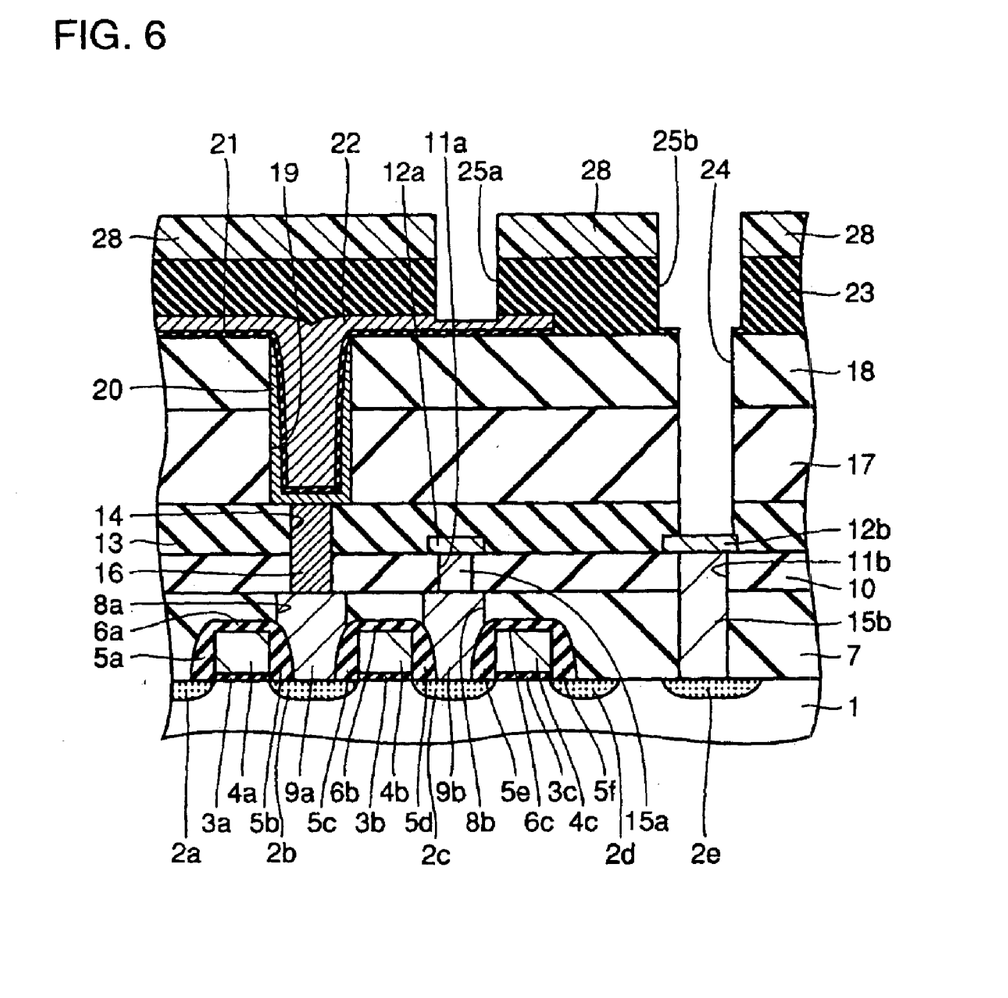

Next, as shown in FIG. 6, by using the resist film 28 as a mask, the sixth interlayer insulating film 23 is partially removed through etching and, thereby, the damascene wiring trenches 25a and 25b are formed. The upper surface of the capacitor upper electrode 22 is exposed at the bottom of the damascene wiling trench 25a. After that the resist film 28 is removed.

In this way, by exposing the capacitor upper electrode 22 through etching for forming the damascene wiring trenches 25a and 25b, the damascene wiling layer including the conductive material film 26a electrically connected to the capacitor upper electrode 22 can be formed without separately forming a contact hole, as shown in a prior art. Accordingly, the process for a semiconductor device can be simplified to a greater extent than in a prior art.

In addition, though the contact hole 152a which is located on the capacitor upper electrode 22 (see FIG. 9) and another contact hole 152b of which the depth is different and which is located in another region are formed through different etching steps in a prior art, a wiring layer including the conductive material film 26b which is located inside of the contact hole 24 and the damascene wiring trench 25b is formed through a so-called dual damascene process and, in addition, the damascene wiling trench 25a for the wiring layer which is connected to the capacitor upper electrode and the damascene wiring trench 25b connected to the contact hole 24 are formed through the same etching step and, thereby, the process for a semiconductor device can be simplified according to the present invention. Therefore, the manufacturing cost of the semiconductor device can be reduced.

In addition, the depth of the damascene wiling trenches 25a and 25b are made approximately equal to the depth from the upper surface of the sixth interlayer insulating film 23 to the upper surface of the capacitor upper electrode 22 and, thereby, the capacitor upper electrode 22 can be prevented from being excessively etched. And since the upper surface of the capacitor upper electrode 22 is exposed at the bottom of the damascene wiling trench 25a, the barrier metal layer 34a and the capacitor upper electrode 22 can be made to contact without fail as described below. Accordingly, the capacitor upper electrode 22 via the barrier metal layer 34a and the entire lower surface of the conductive material film 26 used as a damascene wiling layer can be connected via the barrier metal layer 34a. As a result of this, electric contact between the capacitor upper electrode 22 and the conductive material film 26 used as a damascene wiling layer can be made without fail.

Following the step shown in FIG. 6, a barrier metal layer is formed inside of the damascene wiling trenches 25a and 25b as well as inside the contact hole 24. A conductive material film made up of copper, or the like, is formed on the barrier metal layer so as to fill in inside of the damascene wiring trenches 25a and 25b as well as the inside of the contact hole 24 and to extend to the upper surface of the sixth interlayer insulating film 23. Then, the barrier metal layer and the conductive material film located on the upper surface of the sixth interlayer insulating film 23 are removed by using a CMP method, or the like. In this way, the barrier metal layer 34a and 34b as well as the conductive material film 26a and 26b which becomes the damascene wiring type are formed.

In this way, the semiconductor device as shown in FIGS. 1 and 2 can be gained.

(Second Embodiment)

Figure 7:
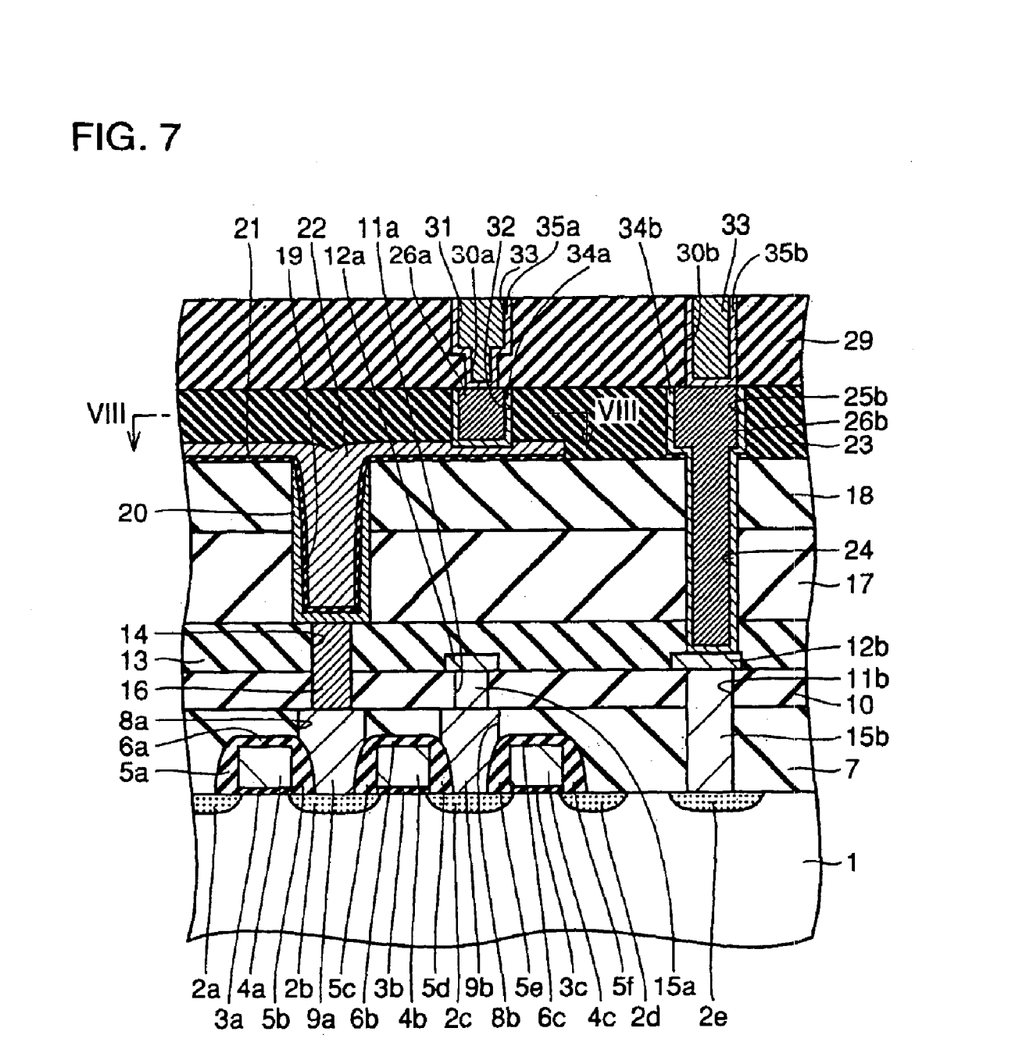
FIG. 7 is a schematic cross section view showing a second embodiment of a semiconductor device according to the present invention.
Figure 8:
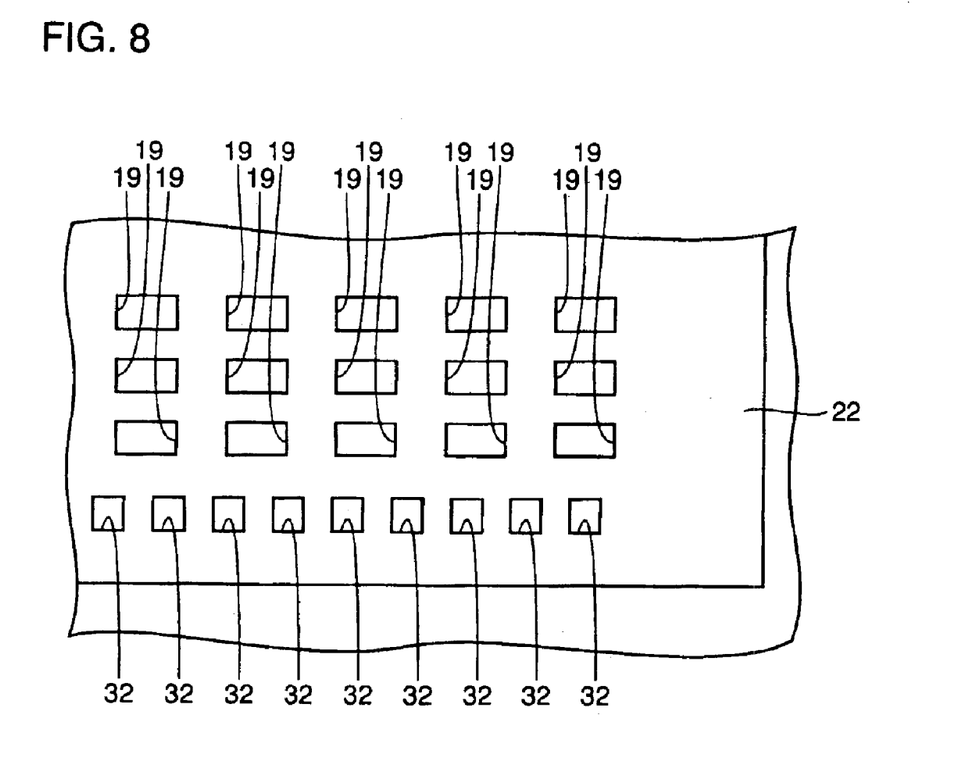
FIG. 8 is a schematic view showing a cross section along line VIII—VIII in FIG. 7.

Referring to FIGS. 7 and 8 a semiconductor device of the second embodiment according to the present invention is described.

Referring to FIGS. 7 and 8 the semiconductor device is a DRAM, which basically includes the same structure as the semiconductor device of the first embodiment according to the present invention as shown in FIGS. 1 and 2. In the semiconductor device as shown in FIGS. 7 and 8, however, a plurality of contact holes 32 are formed on the capacitor upper electrode 22 instead of the damascene wiring trench. The depth of the contact hole 32 is set so as to be approximately equal to the depth of the damascene wiring trench 25b. A barrier metal layer 34a is formed inside of this contact hole 32 in the same way as in the damascene wiring trench 25a as shown in FIG. 1. A conductive material film 26a, which includes copper or the like so as to fill in into the contact hole 32, is formed on the barrier metal layer 34a.

Then, the seventh interlayer insulating film 29 is formed on the sixth interlayer insulating film. A contact hole 30a is formed in the seventh interlayer insulating film 29 above the contact hole 32. A damascene wiling trench 31 is formed above this contact hole 30a. A barrier metal layer 35a is formed inside of the contact hole 30a and inside of the damascene wiring trench 31. A conductive material film 33, such as copper, is formed on the barrier metal layer 35a so as to fill in the inside of the contact hole 30a and the inside of the damascene wiling trench 31. The damascene wiring trench 31 is formed so as to extend in the direction approximately vertical to the paper surface. The conductive material film 33 is connected, via the contact hole 30a, to each of the conductive material films 26a which are located inside of a plurality of contact holes 32 which are formed so as to be lined up in the direction perpendicular to the paper surface.

In addition, a contact hole 30b is formed in the region located above the conductive material film 26b. A barrier metal layer 35b is formed inside of the contact hole 30b. A conductive material film 33, such as copper, is formed on the barrier metal layer 35b so as to fill in the inside of the contact hole 30b.

Here, the contact area between the conductive material film 26a and the capacitor upper electrode 22 can be changed by changing the plane shape of the contact hole 32.

The semiconductor device as shown in FIGS. 7 and 8 can be processed, basically, by the same steps as in the process for a semiconductor device according to the first embodiment of the present invention as shown in FIGS. 3 to 6. That is to say, after carrying out the steps as shown in FIGS. 3 and 4, in the step as shown in FIG. 5 a hole pattern for forming contact holes 32 is formed in the regions located above the capacitor upper electrodes 22 of the resist film 28 instead of the pattern for the damascene wiring trenches. After that, the step as shown in FIG. 6 is carried out. Then, the semiconductor device as shown in FIGS. 7 and 8 can be gained by forming the seventh interlayer insulating film 29, the contact holes 30a and 30b and the conductive material film 33.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising:

the step of forming a capacitor electrode on a semiconductor substrate;

the step of forming an insulating film which has an upper surface on said capacitor electrode;

the step of forming a trench in said insulating film so as to expose part of capacitor electrode;

the step of forming a conductive material film which fills in the inside of said trench and which extends to the upper surface of sad insulating film;

the step of forming a wiring layer which includes said conductive material film which fills in the inside of said trench and which has the upper surface located on approximately the same plane as the upper surface of said insulating film by removing said conductive material film located on the upper surface of said insulating film and by removing part of said conductive material film located in the trench of said insulating film;

the step of forming a conductive region located below said insulating film; and the step of forming, in said insulating film, a contact hole which reaches to said conductive region, wherein said step of forming a trench includes forming another trench in said insulating film the region located above said contact hole; and said step of forming a conductive material film includes forming a conductive material film which becomes another wiring layer so as to fill in the inside of said contact hole and said other trench.

2. The method of manufacturing a semiconductor device according to claim 1, wherein said step of forming a trench includes forming said trench so as to extend approximately in parallel to said other trench.

3. The method of manufacturing semiconductor device according to claim 1, wherein said step of forming a trench includes forming a plurality of aperture parts so as to expose part of said capacitor electrode in said insulating film.

4. The method of manufacturing a semiconductor device according to claim 1, wherein said conductive material film includes copper.

* * * * *